(12) United States Patent
Hasegawa et al.

(10) Patent No.: US 8,091,710 B2
(45) Date of Patent: Jan. 10, 2012

(54) DOOR STRUCTURE AND SUBSTRATE STORAGE CONTAINER

(75) Inventors: Akihiro Hasegawa, Itoigawa (JP); Junya Toda, Itoigawa (JP)

(73) Assignee: Shin-Etsu Polymer Co., Ltd., Tokyo (JP)

( * ) Notice: Subject to any disclaimer, the term of this patent is extended or adjusted under 35 U.S.C. 154(b) by 254 days.

(21) Appl. No.: 12/444,545

(22) PCT Filed: Sep. 28, 2007

(86) PCT No.: PCT/JP2007/069015
§ 371 (c)(1),
(2), (4) Date: Apr. 6, 2009

(87) PCT Pub. No.: WO2008/044495
PCT Pub. Date: Apr. 17, 2008

(65) Prior Publication Data
US 2010/0032339 A1  Feb. 11, 2010

(30) Foreign Application Priority Data

Oct. 6, 2006  (JP) .................................. 2006-275248

(51) Int. Cl.
*B65D 85/48* (2006.01)

(52) U.S. Cl. ........................................ 206/711; 206/754
(58) Field of Classification Search .................. 206/710, 206/711, 454; 292/36, 66; 220/323, 315; 70/63, 432, 330
See application file for complete search history.

(56) References Cited

U.S. PATENT DOCUMENTS

| | | | | |
|---|---|---|---|---|
| 1,362,647 A * | 12/1920 | Stone et al. | ..................... | 40/460 |
| 2,565,669 A * | 8/1951 | Smith | ............................ | 116/290 |
| 4,490,999 A * | 1/1985 | Castle et al. | ..................... | 70/432 |
| 5,711,427 A | 1/1998 | Nyseth | | |
| 5,915,562 A | 6/1999 | Nyseth et al. | | |
| 6,010,008 A | 1/2000 | Nyseth et al. | | |
| 6,105,782 A * | 8/2000 | Fujimori et al. | .............. | 206/710 |
| 6,457,598 B1 * | 10/2002 | Hsieh et al. | ..................... | 220/323 |
| 6,622,883 B1 * | 9/2003 | Wu et al. | ......................... | 220/323 |
| 6,712,213 B2 * | 3/2004 | Eggum | ........................ | 206/711 |
| 6,749,067 B2 * | 6/2004 | Eggum | ........................ | 206/710 |
| 7,913,437 B2 * | 3/2011 | Domenig et al. | ............... | 40/495 |

(Continued)

FOREIGN PATENT DOCUMENTS

CN          1205299 A         1/1999

(Continued)

OTHER PUBLICATIONS

International Search Report for PCT/JP2007/069015 mailed Oct. 23, 2007 (1 page).

(Continued)

*Primary Examiner* — David Fidei
(74) *Attorney, Agent, or Firm* — Osha • Liang LLP (57) ABSTRACT

A door structure that is detachably fitted into an opening portion of a container body for storing substrates includes a casing to be fitted to the opening portion of the container body, a locking mechanism provided in the casing for locking the casing by causing an engaging piece to project out from the peripheral wall of the casing in a retractable manner based on rotation of a rotator so as to interfere with the inner periphery of the opening portion of the container body, a cover for enclosing the locking mechanism, and an operational window formed in the cover so as to oppose the rotator.

6 Claims, 5 Drawing Sheets

U.S. PATENT DOCUMENTS

| | | | |
|---|---|---|---|
| 2002/0106266 A1* | 8/2002 | Bonora et al. | 414/217 |
| 2003/0132136 A1* | 7/2003 | Eggum | 206/710 |
| 2003/0132232 A1* | 7/2003 | Eggum | 220/323 |
| 2004/0040884 A1* | 3/2004 | Pai et al. | 206/710 |
| 2005/0224391 A1* | 10/2005 | Bores et al. | 206/710 |
| 2005/0230398 A1 | 10/2005 | Hasegawa et al. | |
| 2006/0102632 A1 | 5/2006 | Matsutori et al. | |
| 2007/0080096 A1* | 4/2007 | Miyajima et al. | 206/710 |
| 2008/0302700 A1 | 12/2008 | Nyseth et al. | |

FOREIGN PATENT DOCUMENTS

| | | |
|---|---|---|
| JP | 11-091864 A | 4/1999 |
| JP | 11-91865 | 4/1999 |
| JP | 2003-174081 | 6/2003 |

OTHER PUBLICATIONS esp@cenet Patent Abstract 2003-174081 published Jun. 20, 2003 (1 page).

English translation of PCT International Preliminary Report on Patentability with PCT Written Opinion of The International Searching Authority issued Apr. 22, 2009, 6 pages.

Patent Abstracts of Japan, Publication No. 11-091864 published Apr. 6, 1999, 1 page.

Office Action for Chinese Application No. 200780037525.0 issued on Jun. 9, 2010 and English translation thereof, 8 pages.

\* cited by examiner

DOOR STRUCTURE AND SUBSTRATE STORAGE CONTAINER

TECHNICAL FIELD

The present invention relates to a door structure for a container body for storing substrates such as semiconductor wafers and the like as well as a substrate storage container.

BACKGROUND ART

Though not illustrated, a conventional substrate storage container is comprised of a container body for storing a plurality of substrates such as semiconductor wafers in alignment and a door structure to be detachably fitted into the open front portion of the container body. This substrate storage container is set to semiconductor wafer processing equipment in a mass-production process of semiconductor parts, and its door structure is automatically opened and closed by a door opening/closing device of the processing equipment, to meet the demands for cleanness (see Patent documents 1 and 2).

While the substrate storage container is basically constructed such that the door structure is opened and closed automatically by the door opening/closing device of the processing equipment, the door structure is manually opened and closed by an operator when a trouble takes place or when a test is carried out. In this case, the operator detaches the door structure from the container body using a dedicated small tool or detaches the door structure from the container body by turning the opening/closing handle for manual operation, which is previously attached in a pivotable manner on the front side of the door structure.

Patent Document 1

Japanese Patent Application Laid-open Hei 11 No. 91864

Patent Document 2

Japanese Patent Application Laid-open 2003-174081

DISCLOSURE OF THE INVENTION

Problems to be Solved by the Invention

The conventional substrate storage container is thus constructed and the door structure is manually detached from the container body using a dedicated small tool or using an opening/closing handle for manual operation. When a special tool is used, the tool need be provided for each processing stage, and there is a risk of it being lost because it is small. On the other hand, when an opening/closing handle is used, it is necessary to previously attach the opening/closing handle in a pivotable manner on the front side of the door structure, hence it takes time and labor to do this work and there is also the problem that the configuration is complicated.

Since the opening/closing handle is movable, there is also the problem that particles are prone to arise around the frictionally movable parts due to vibration and impacts during transportation. Moreover, there is more than a small concern that it takes a long time for a drying process of the door structure after washing because washing water is prone to stay around the pivot shaft of the opening/closing handle and hollow parts for operation during washing the door structure.

The present invention has been devised in view of the above, it is therefore an object of the present invention to provide a door structure and a substrate storage container with which there is less fear that even when the door is manually opened and closed, its parts, accessories and the like are lost, with which particles are unlikely to arise due to vibration, impacts and the like during transportation and with which it does not take long time to dry after washing.

Means for Solving the Problems

In the present invention, in order to solve the above problem, a door structure that is detachably fitted into an opening portion of a container body for storing substrates, includes: a casing to be fitted to the opening portion of the container body; a locking mechanism provided in the casing for locking the casing by causing an engaging piece to project out from the peripheral wall of the casing in a retractable manner based on rotation of a rotator so as to interfere with the inner periphery of the opening portion of the container body; a cover for enclosing the locking mechanism; and an operational window formed in the cover so as to oppose the rotator.

Here, the locking mechanism may preferably include: an externally operable rotator that is rotatably supported on the casing of the door structure; a plurality of couplers that are supported by the casing and reciprocate inwards and outwards of the casing as the rotator rotates; and a plurality of engaging pieces that are coupled with individual couplers and project from, and retract into, through-holes in the peripheral wall of the casing by reciprocating movement of the couplers.

It is also preferable that the rotator of the locking mechanism includes a manual operating means in the part opposing the operational window.

Also, the manual operating means may comprise a finger insertion hole formed in the rotator of the locking mechanism.

Also, a finger engaging piece may be formed around the finger insertion hole of the rotator.

Also, the manual operating means may comprise an operational bar that is formed with the rotator of the locking mechanism and exposed from the operational window.

Also, the manual operating means may comprise knurling formed on the rotator of the locking mechanism.

Further, in the present invention, in order to solve the above problem, a substrate storage container is characterized in that one of the door structures according to Claims 1 through 6 is detachably fitted into the opening portion of a container body for storing substrates.

Here, the inner periphery of the opening portion of the container body may be formed with a plurality of engaging holes to be interfered by the engaging pieces of the locking mechanism.

Here, the substrates defined in the scope of the claims may at least include a single or plurality of semiconductor wafers, reclaimed wafers, glass wafers and the like of 200 mm, 300 mm and 450 mm in diameter. Further, the container body and substrate storage container are not particularly limited to being transparent, opaque, translucent, of a top open box type, of a front open box type, of a bottom open box type, for in-house, for shipment or the like.

As to the locking mechanism, the number, either single or plural, or removability is not particularly limited. The engaging piece of this locking mechanism may include a claw, roller and the like. The number, either single or plural, or the shape, of the operational window is not particularly limited. For example the operational window may have an arced, circular, rectangular, polygonal, elliptic or other shape. Further, as to the finger insertion hole (either with a bottom or without bottom) of the manual operating means, the finger engaging piece and the operational bar (including a lever etc.), their numbers, either single or plural, and the shape are not particularly limited.

According to the present invention, when the door structure of the container body for storing substrates is opened and closed manually, it is possible to manually operate the locking mechanism to open and close the door structure by inserting fingers, a rod or the like, into the operational window of the cover and turning the rotator of the locking mechanism.

Effect of the Invention

The present invention has the effect that there is less fear that even when, for example the door structure is manually opened and closed, its parts, accessories and the like are lost and that particles are prevented from arising in the door structure due to even undergoing vibration, impacts and the like during transportation. Further it is possible to speed up the drying operation of the door structure after washing.

Further, since it is possible to hook the fingers etc., properly on the rotator of the locking mechanism when the finger insertion hole is used as a manual operating means, the manual operation is made easy.

Further, when the finger insertion hole as the manual operating means is formed with a finger engaging piece, it is possible to positively transfer the operating force from the fingers etc., to the rotator of the locking mechanism.

Moreover, the manual operating means is constructed of knurling formed on the rotator of the locking mechanism, it is possible with a simple configuration to prevent fingers etc., from slipping when the rotator of the locking mechanism is operated.

DESCRIPTION OF REFERENCE NUMERALS

1 Container body
2 Open front portion (opening portion)
10 Door structure
11 Casing
14 Locking mechanism
15 Rotary plate (rotator)
16 Operational hole
19 Coupling plate
21 Engaging claw (engaging piece)
22 Cover plate (cover)
24 Operational opening
30 Operational window
40 Manual operating means
41 Finger insertion hole
42 Finger engagement rib
43 Operational bar
43A Operational bar
44 Knurling

BEST MODE FOR CARRYING OUT THE INVENTION

Referring to the drawings, a preferred embodiment of the present invention will be described hereinbelow. As shown in FIGS. 1 through 8, a substrate storage container of the present embodiment includes a container body 1 for accommodating a plurality of substrates, a door structure 10 to be detachably fitted in a sealing manner into an open front portion 2 of this container body 1. This door structure 10 is constructed of a casing 11 detachably fitted into open front portion 2 of container body 1, a plurality of locking mechanisms 14 disposed on the front side of this casing 11 for locking casing 11 by projecting a plurality of engaging claws 21 from the peripheral wall of casing 11 in a retractable manner as each rotary plate 15 is turned so that the claws engage the inner periphery of open front portion 2 of container body 1, a plurality of cover plates 22 attached on the front side of casing 11 to cover individual locking mechanisms 14, and a plurality of operational windows 30 which are each formed in cover plate 22 so as to partially oppose individual rotary plate 15. A manual operating means 40 is provided for rotary plate 15 of each locking mechanism 14 at the position opposing operational window 30.

Though not shown, the substrates are thin round semiconductor wafers (Si wafers and the like) of 300 mm in diameter, and in order to distinguish the crystal orientation and position the semiconductor wafers, part of its periphery is selectively and linearly cut out to form an orientation flat, or part of its periphery is cut out with a substantially narrow groove to form a notch. Stored and aligned in container body 1 are 1 to 25 or 1 to 26 substrates.

Figure 1:
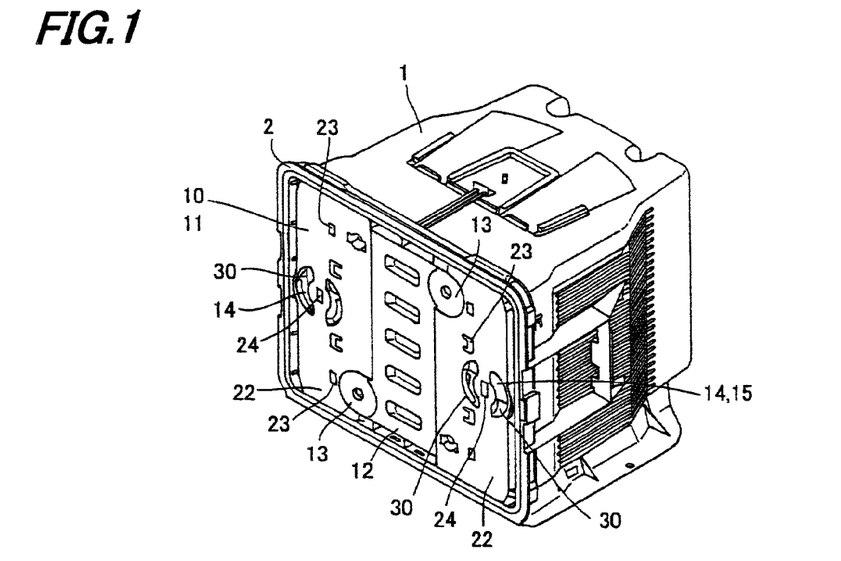
[FIG. 1] is an overall perspective illustrative view schematically showing the embodiment of a door structure and a substrate storage container according to the present invention.

As shown in FIG. 1, container body 1 is injection molded using a predetermined molding material into a front open box type having an opening on its front side. Examples of molding material for this container body 1 include thermoplastic resin such as polycarbonate, cycloolefin polymer, polyether imide, polyether sulfone, polyether ether ketone and the like. This thermoplastic resin is blended with conducive components such as conductive carbon, conductive fibers, metal fibers, conductive high polymers, etc., various antistatic agents, UV absorbers and the like, as appropriate.

In container body 1, a pair of left and right rear retainers for fitting and holding the rear peripheral part of the substrate are projectively formed on the rear interior side. Pairs of the rear retainers are formed vertically at intervals of a predetermined gap. Further, a pair of left and right teeth that horizontally support substrates at their periphery on both sides are projectively formed on both interior sides of container body 1. Pairs of left and right teeth opposing each other are formed vertically at intervals of a predetermined gap.

Figure 2:
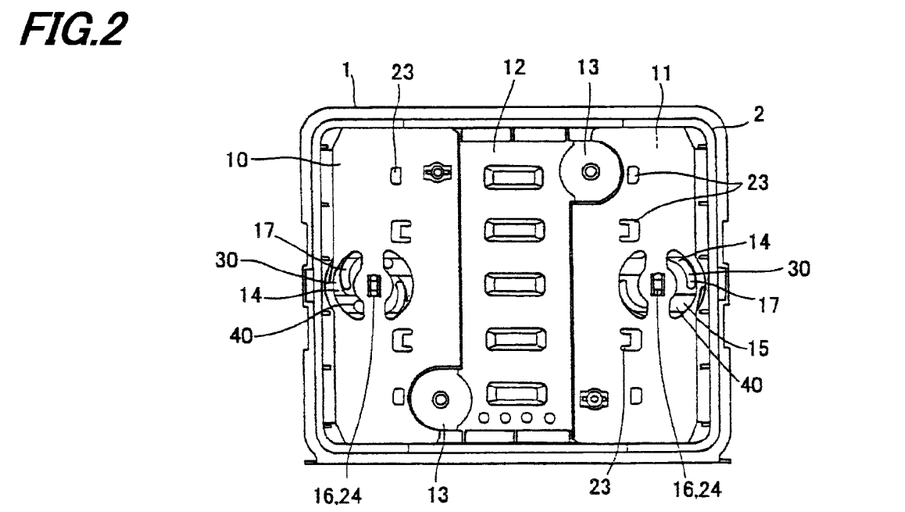
[FIG. 2] is a front illustrative view schematically showing a door structure in the embodiment of a door structure and a substrate storage container according to the present invention.
Figure 3:
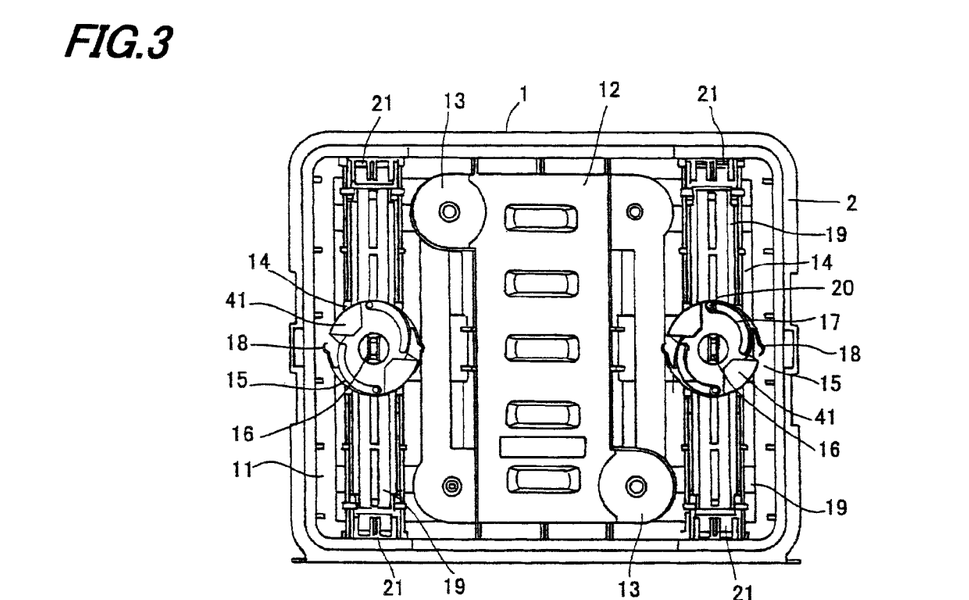
[FIG. 3] is a front illustrative view schematically showing the door structure of FIG. 2 from which its cover is detached.
Figure 4:
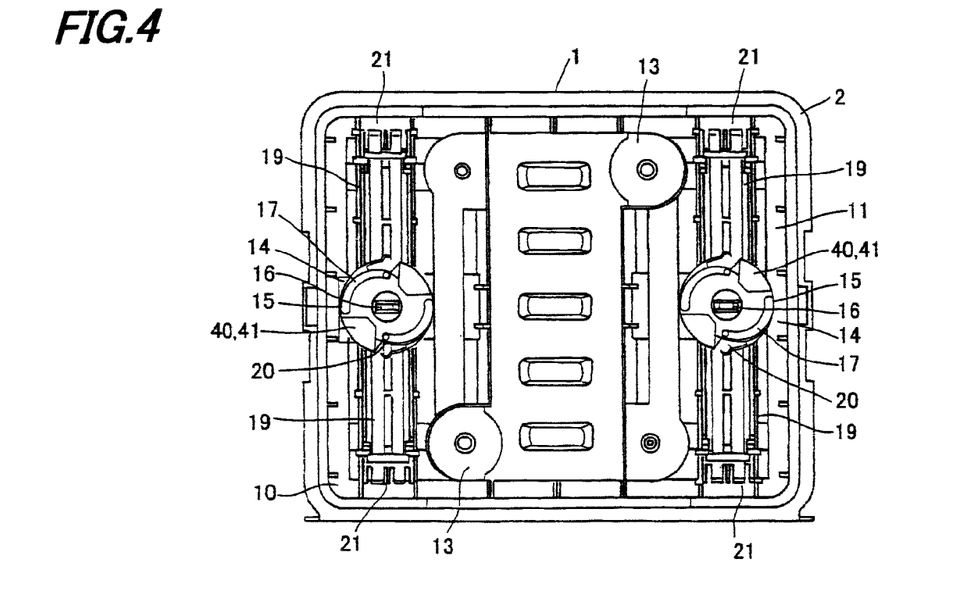
[FIG. 4] is a front illustrative view schematically showing a state where the rotary plates in FIG. 3 are rotated 90°.

Detachably attached to the bottom of container body 1 is a flat bottom plate of an approximately Y-shape, polygon, triangle or the like. This bottom plate is attached and arranged with a plurality of positioning tools having an approximately V-shaped section for positioning to unillustrated processing equipment. Attached to the top center of container body 1 is a detachable flange having an approximately rectangular shape, when viewed from top, which is held by an unillustrated transport robot. Open front portion 2 of container body 1 is bent and formed to have a step extended outwards, as shown in FIGS. 1 and 2. The flat stepped surface of this step functions to be the seal-forming surface for door structure 10.

A pair of left and right engaging holes for receiving engaging claws 21 of locking mechanism 14 are hollowed and formed a predetermined distance apart from each other at top and bottom on the inner periphery of open front portion 2 of container body 1 while manual handles to be gripped by the operator are detachably attached in the center of the outer surface of both the left and right side portions of container body 1.

Casing 11 of door structure 10, multiple locking mechanisms 14, multiple cover plates 22 and manual operating means 40 are molded using the same molding material as for container body 1. As shown in FIGS. 1 to 4, casing 11 is basically formed in a laterally-long rectangular shape having an approximately dish-like section with a central part 12 of an approximately rectangle protruded to the surface side (front side) so as to relatively form hollows on the left and right side portions. Locking mechanisms 14 are arranged inside both the left and right hollows while rectangular through-holes are formed at both sides on the top and bottom peripheral walls.

As shown in the same drawings, in central part 12 of casing 11, circular suction areas 13 to be suctioned by door opening/closing device of the processing equipment are formed at the top and the bottom on both sides on the front side while an elastic front retainer for fitting and horizontally holding the front edges of substrates is detachably attached on the hollowed interior side. Further, a frame-like endless fitting and holding groove having an approximately U-shaped section is formed along the periphery of the interior side of casing 11. Inserted into this fitting and holding groove is an elastically deformable sealing gasket that comes into press-contact with the seal-forming surface of container body 1. This sealing gasket is formed endlessly using, for example silicone rubber, fluororubber or the like.

As shown in FIGS. 3 through 7, each locking mechanism 14 includes: a rotary plate 15 that is rotatably supported on the front side of casing 11 and rotationally operated from the outside of door structure 10 by the door opening/closing device of the processing equipment; a pair of coupling plates 19 which each are slidably supported on the front side of casing 11 by a plurality of guide pins and guides and slide vertically inwards and outwards of casing 11 as rotary plate 15 rotates; and a pair of engaging claws 21 which are each axially supported near the through-hole on the peripheral wall of casing 11 and axially coupled by the front end of each coupling plate 19 so as to be projected from and retracted into respective through-holes on the peripheral wall of casing 11 as coupling plates 19 slide.

Each rotary plate 15 is formed so as to have an approximately convex section while an operational hole 16 having a rectangular shape when viewed from the front, for permitting external operation is hollowed in the circular center portion projected to the front side. This rotary plate 15 has a pair of arc slots 17 bored approximately 180° apart from each other along the periphery thereof and also has a pair of flexible bent pieces 18 formed approximately 180° apart on the peripheral edge.

Each coupling plate 19 as a coupler is provided in the form of a rectangular flat plate, and a cylindrical coupling pin 20 at the end on the front side is fitted in arc slot 17 of rotary plate 15 and coupled therewith. As rotary plate 15 rotates in one direction, the thus constructed coupling plates 19 slide vertically outwards of casing 11 so as to cause engaging claws 21 that will fit to the engaging holes of container body 1 to project out from the through-holes in the peripheral wall. As rotary plate 15 rotates in the other direction, the plates slide vertically inwards of casing 11 so as to cause engaging claws 21 to return to their original positions.

Figure 8:
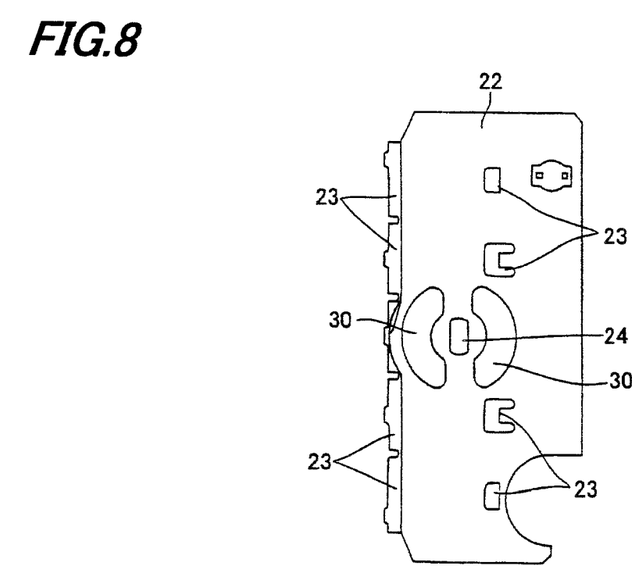
[FIG. 8] is a front illustrative view schematically showing a cover in the embodiment of a door structure and a substrate storage container according to the present invention.

As shown in FIGS. 1, 2 and 8, each cover plate 22 is given in a vertical long shape corresponding to either side part of casing 11, and a plurality of flexible engaging pieces 23 that detachably engage casing 11 and the side faces of its central portion are projectively formed. This cover plate 22 has an operational opening 24 having a rectangular shape, viewed from the front, which opposes operational hole 16 of rotary plate 15 and communicates therewith. When the operating key of the door opening/closing device is inserted into operational hole 16 of rotary plate 15 through this operational opening 24 and rotated, each locking mechanism 14 is operated from the outside.

As shown in FIGS. 1, 2 and 8, multiple operational windows 30 are formed so that a pair of hollows are arranged in approximately the central portion of each cover plate 22 on the left and right sides of operational opening 24. Each operational window 30 has an approximately arc shaped configuration when viewed from the front, partially opposing the front side of rotary plate 15 and functions to allow for manual operation from the outside.

Figure 5:
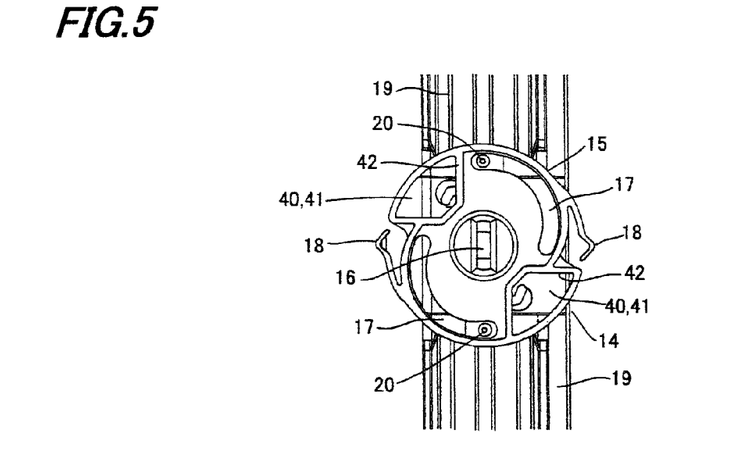
[FIG. 5] is a front illustrative view schematically showing a rotary plate in a locking mechanism in the embodiment of a door structure and a substrate storage container according to the present invention.
Figure 6:
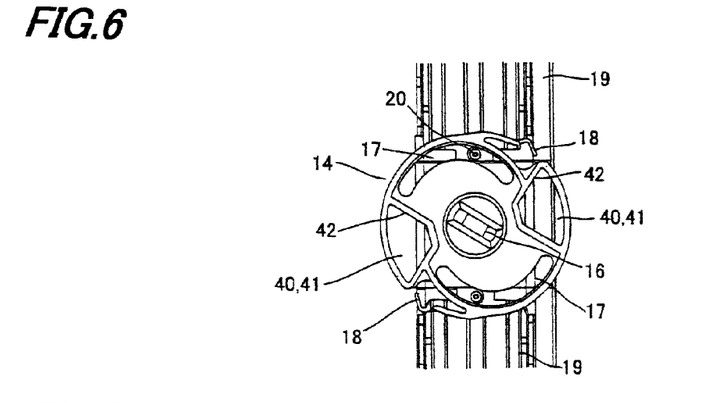
[FIG. 6] is a front illustrative view schematically showing a state where the rotary plate of FIG. 5 has been rotated.
Figure 7:
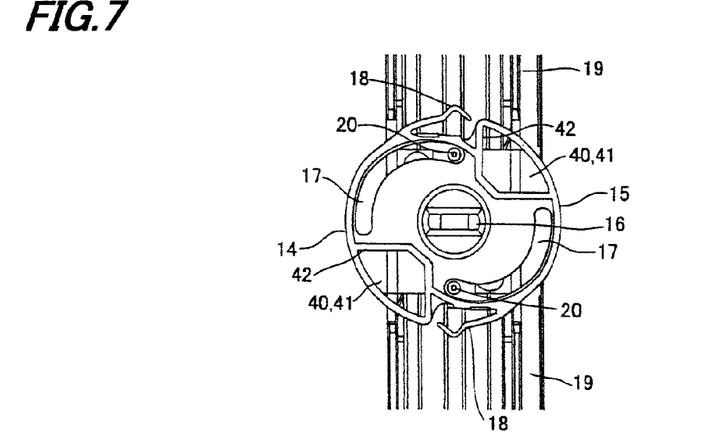
[FIG. 7] is a front illustrative view schematically showing a state where the rotary plate of FIG. 6 has been rotated.

Manual operating means 40 is formed of, as shown in FIGS. 5 to 7, a pair of finger insertion holes 41, bored in an approximately sectoral form when viewed from the front, and arranged 180° part from each other in rotary plate 15 at the positions opposing operational windows 30, and finger engagement ribs 42 projectively formed from part of the periphery of each finger insertion hole 41. This manual operating means 40 is molded using the same molding material as for container body 1.

Here, operational window 30 and finger insertion hole 41 are preferably sized conforming to SEMI standard S8 (ergonomics engineering for semiconductor manufacturing equipment) for example.

In the above, when door structure 10 is manually detached from container body 1, fingers are fitted into operational windows 30 of each cover plate 22 and inserted into finger insertion holes 41 of manual operating means 40 so as to engage finger engagement ribs 42 and turn rotary plate 15 in an arbitrary direction. As a result, locking mechanism 14 is operated, whereby door structure 10 fitted in open front portion 2 of container body 1 can be manually detached.

According to the above, since it is possible to simply detach door structure 10 from container body 1 by manual operation by use of finger insertion holes 41 and finger engagement ribs 42 of manful operating means 40 without the need of any dedicated small tool, it is not necessary at all to provide any tool at each processing stage, hence there is no fear of such a tool missing. Further, since it is no longer necessary to previously provide a pivotable opening/closing handle on the front side of door structure 10, it is possible to not only smoothen, simplify, speed up and make easy the opening and closing work of door structure 10, but also simplify the configuration of door structure 10. Moreover, since the opening/closing handle can be omitted, there is no risk of particles arising at the frictionally moving part due to vibration and impacts during transportation.

Further, since no washing water will stay around the pivot shaft of the opening/closing handle and hollow parts for operation due to omission of the opening/closing handle, it is possible to speed up the drying operation after washing. Also, since finger insertion holes 41 and finger engagement ribs 42 are arranged in rotary plate 15 at the positions opposing operational windows 30, fingers can be easily inserted so that manual operation will not be hindered. Further, since fingers can be engaged properly when finger insertion holes 41 of manual operating means 40 are used, the manual operation can be made easy. Moreover, use of finger engagement ribs 42 makes it possible to positively transfer the finger's operating force to rotary plate 15.

Figure 9:
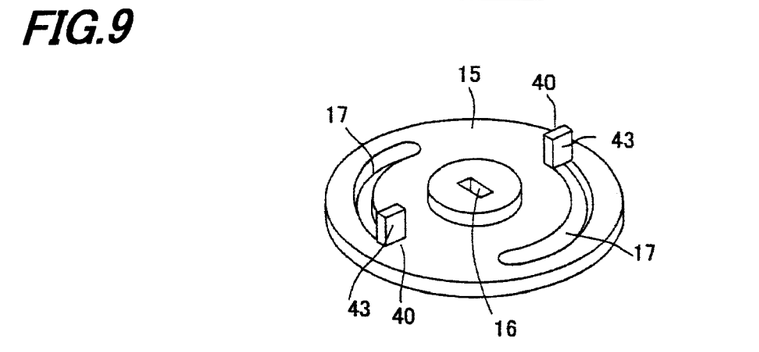
[FIG. 9] is a perspective illustrative view schematically showing a rotary plate of a locking mechanism in the second embodiment of a door structure and a substrate storage container according to the present invention.
Figure 10:
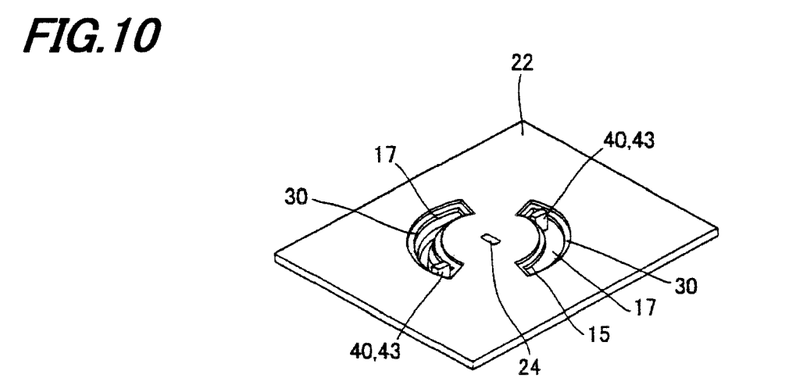
[FIG. 10] is a perspective illustrative view schematically showing a locking mechanism in the second embodiment of a door structure and a substrate storage container according to the present invention.

Next, FIGS. 9 and 10 show the second embodiment of the present invention. In this case, manual operating means 40 is formed of a pair of operational bars 43 that are projectively formed from the front side of each rotary plate 15 and exposed from operational windows 30 of each cover plate 22.

Each operational bar 43 is given in the form of a linear short rectangular or square piece and arranged adjacent to the end of each arc slot 17 so as to allow the operator to handle and rotate rotary plate 15 with their fingers. Other components are the same as in the above embodiment, so description is omitted.

Also in the present embodiment, it is possible to expect the same operation and effect as in the above embodiment. In addition, since operational bar 43 is projected from each operational window 30 of cover plate 22, it is obvious that the amount of insertion of fingers when a manual operation is to be done can be reduced. Further, the shape and configuration of manual operating means 40 can be diversified.

Figure 11:
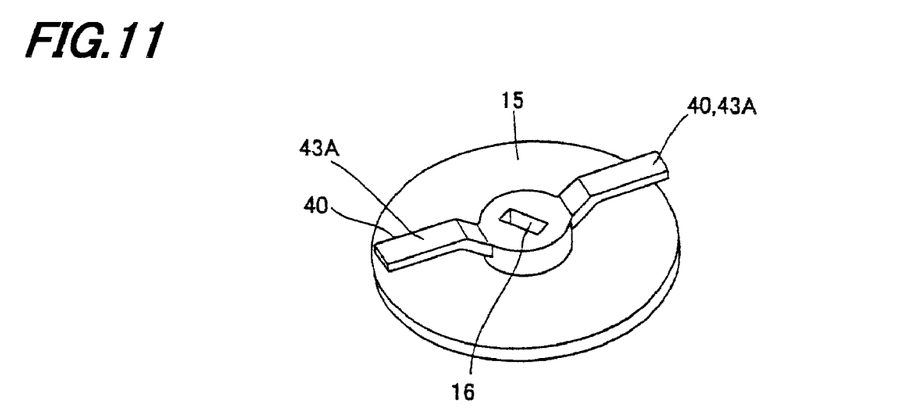
[FIG. 11] is a perspective illustrative view schematically showing a rotary plate of a locking mechanism in the third embodiment of a door structure and a substrate storage container according to the present invention.
Figure 12:
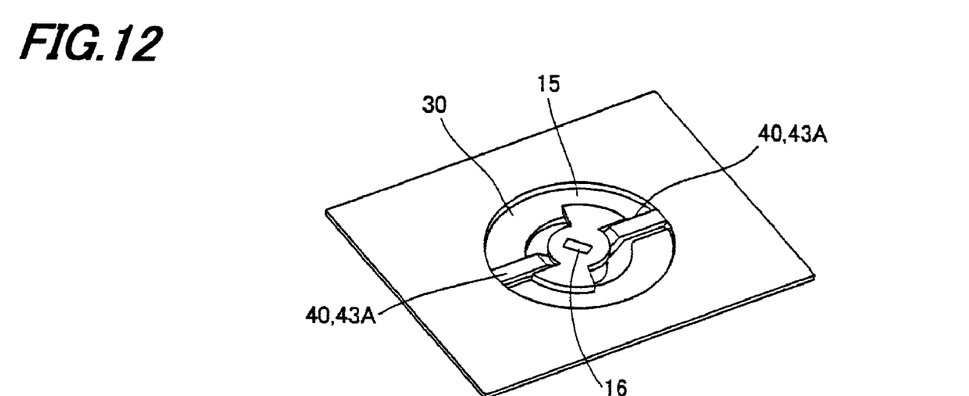
[FIG. 12] is a perspective illustrative view schematically showing a locking mechanism in the third embodiment of a door structure and a substrate storage container according to the present invention.

Next, FIGS. 11 and 12 show the third embodiment of the present invention. In this case, manual operating means 40 is formed of a pair of operational bars 43A that are formed 180° apart from each other about the center on the front side of each rotary plate 15 and is exposed from circular operational windows 30 of each cover plate 22.

Each operational bar 43A is given as an approximately open V-shaped bent form greater and longer than operational bar 43, and extended radially outwards from the center on the front side of each rotary plate 15 so as to allow the operator to handle and rotate rotary plate 15 with their fingers. Other components are the same as in the above embodiment, so description is omitted.

Also in the present embodiment, it is possible to expect the same operation and effect as in the above embodiment. In addition, since each operational bar 43A is greater and longer than operational bar 43, it is obvious that a further improved operability can be obtained.

Figure 13:
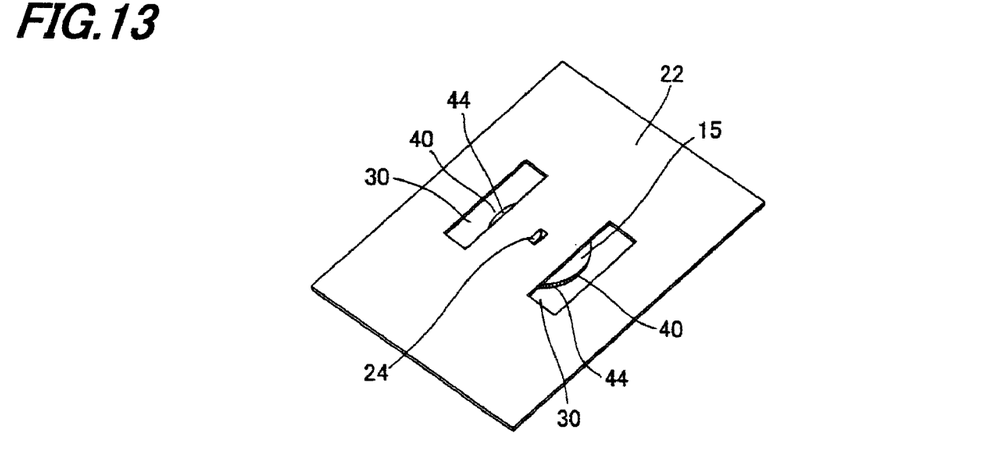
[FIG. 13] is a perspective illustrative view schematically showing a locking mechanism in the fourth embodiment of a door structure and a substrate storage container according to the present invention.

Next, FIG. 13 shows the fourth embodiment of the present invention. In this case, manual operating means 40 is formed by knurling 44 for anti-slipping, which is formed by arranging a plurality of incised ridges side by side or obliquely on the peripheral side of each rotary plate 15 and is exposed from a plurality of rectangular operational windows 30 in each cover plate 22. Other components are the same as in the above embodiment, so description is omitted.

In the above, when door structure 10 is manually detached from container body 1, fingers are fitted into operational windows 30 of each cover plate 22 and applied on the jagged knurling 44 of manual operating means 40 so as to turn rotary plate 15 in an arbitrary direction. As a result, rotary plate 15 will turn smoothly without slip.

Also in the present embodiment, it is possible to expect the same operation and effect as in the above embodiment. In addition, since it is no longer necessary to newly provide a plurality of operational bars 43 for rotary plate 15, the configuration of rotary plate 15 can be simplified.

The invention claimed is:

1. A door structure that is detachably fitted into an opening portion of a container body for storing substrates, comprising:
    a casing to be fitted to the opening portion of the container body;
    a locking mechanism provided in the casing for locking the casing by causing an engaging piece to project out from the peripheral wall of the casing in a retractable manner based on rotation of a rotator so as to interfere with the inner periphery of the opening portion of the container body;
    a cover for enclosing the locking mechanism; and
    an operational window formed in the cover so as to oppose the rotator,
    wherein the rotator of the locking mechanism comprises a manual opening portions formed at a pair of finger insertion holes arranged at a periphery distinctly apart from a center of the rotation of the rotator; and
    wherein a finger engagement piece is projectively formed around at least one of the finger insertion holes.

2. The door structure according to claim 1, wherein the manual opening portion comprises an operational bar that is formed with the rotator of the locking mechanism and exposed from the operational window.

3. The door structure according to claim 1, wherein the manual opening portion comprises knurling formed on the rotator of the locking mechanism.

4. A substrate storage container including a door structure that is detachably fitted into the opening portion of a container body for storing substrates, the door structure comprising:
    a casing to be fitted to the opening portion of the container body;
    a locking mechanism provided in the casing for locking the casing by causing an engaging piece to project out from the peripheral wall of the casing in a retractable manner based on rotation of a rotator so as to interfere with the inner periphery of the opening portion of the container body;
    a cover for enclosing the locking mechanism; and
    an operational window formed in the cover so as to oppose the rotator,
    wherein the rotator of the locking mechanism comprises manual opening portions formed at a pair of finger insertion holes arranged at a periphery distinctly apart from a center of the rotation of the rotator; and wherein the finger engagement piece is projectively formed around at least one of the finger insertion holes.

5. The substrate storage container according to claim 4, wherein the manual opening portion comprises an operational bar that is formed with the rotator of the locking mechanism and exposed from the operational window.

6. The substrate storage container according to claim 4, wherein the manual opening portion comprises knurling formed on the rotator of the locking mechanism.

* * * * *